United States Patent
Chua et al.

(10) Patent No.: US 7,605,008 B2
(45) Date of Patent: Oct. 20, 2009

(54) PLASMA IGNITION AND COMPLETE FARADAY SHIELDING OF CAPACITIVE COUPLING FOR AN INDUCTIVELY-COUPLED PLASMA

(75) Inventors: Thai Cheng Chua, Cupertino, CA (US); James P. Cruse, Soquel, CA (US); Cory Czarnik, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 11/695,553

(22) Filed: Apr. 2, 2007

(65) Prior Publication Data

US 2008/0241419 A1    Oct. 2, 2008

(51) Int. Cl.
*H01L 21/318*  (2006.01)
*H01L 21/66*  (2006.01)

(52) U.S. Cl. .............................. 438/7; 438/10; 438/776; 438/FOR. 141; 257/E21.293; 257/E21.302; 257/E21.528

(58) Field of Classification Search ............... 438/9, 438/10, 7, 776, FOR. 141; 257/E21.529, 257/E21.293, E21.302, E21.528
See application file for complete search history.

(56) References Cited

U.S. PATENT DOCUMENTS

| | | | |
|---|---|---|---|
| 5,726,523 A * | 3/1998 | Popov et al. | 313/161 |
| 5,779,849 A * | 7/1998 | Blalock | 156/345.48 |
| 5,811,022 A * | 9/1998 | Savas et al. | 216/68 |
| 6,220,201 B1 | 4/2001 | Nowak et al. | |
| 6,248,251 B1 * | 6/2001 | Sill | 216/68 |
| 6,388,382 B1 * | 5/2002 | Doi et al. | 315/111.51 |
| 6,447,637 B1 | 9/2002 | Todorov et al. | |
| 6,465,051 B1 * | 10/2002 | Sahin et al. | 427/534 |
| 6,551,447 B1 * | 4/2003 | Savas et al. | 156/345.48 |
| 6,660,659 B1 | 12/2003 | Kraus et al. | |
| 6,756,737 B2 * | 6/2004 | Doi et al. | 315/111.51 |
| 6,770,166 B1 | 8/2004 | Fischer | |
| 2001/0037861 A1 * | 11/2001 | Kazumi et al. | 156/345 |
| 2002/0005169 A1 * | 1/2002 | Daviet | 118/723 I |
| 2002/0023899 A1 * | 2/2002 | Khater et al. | 219/121.41 |
| 2002/0067133 A1 * | 6/2002 | Brown et al. | 315/111.51 |
| 2003/0006009 A1 * | 1/2003 | Todorov et al. | 156/345.48 |
| 2003/0168427 A1 * | 9/2003 | Flamm et al. | 216/2 |
| 2004/0021525 A1 * | 2/2004 | Finley | 333/32 |
| 2004/0160190 A1 * | 8/2004 | Gonzalez et al. | 315/111.51 |
| 2004/0163595 A1 * | 8/2004 | Edamura et al. | 118/723 I |
| 2004/0206730 A1 * | 10/2004 | Holber et al. | 219/121.52 |
| 2007/0103092 A1 * | 5/2007 | Millner et al. | 315/276 |
| 2008/0241419 A1 * | 10/2008 | Chua et al. | 427/569 |

FOREIGN PATENT DOCUMENTS

EP    0607797 A1    7/1994

* cited by examiner

*Primary Examiner*—George Fourson
(74) *Attorney, Agent, or Firm*—Patterson & Sheridan, LLP

(57) ABSTRACT

A method and apparatus for igniting a gas mixture into plasma using capacitive coupling techniques, shielding the plasma and other contents of the plasma reactor from the capacitively-coupled electric field, and maintaining the plasma using inductive coupling are provided. For some embodiments, the amount of capacitive coupling may be controlled after ignition of the plasma. Such techniques are employed in an effort to prevent damage to the surface of a substrate from excessive ion bombardment caused by the highly energized ions and electrons accelerated towards and perpendicular to the substrate surface by the electric field of capacitively-coupled plasma.

10 Claims, 5 Drawing Sheets

PLASMA IGNITION AND COMPLETE FARADAY SHIELDING OF CAPACITIVE COUPLING FOR AN INDUCTIVELY-COUPLED PLASMA

BACKGROUND OF THE INVENTION

1. Field of the Invention

Embodiments of the present invention generally relate to plasma nitridation and, more particularly, to methods and apparatus for igniting and maintaining a plasma without causing ion bombardment damage to a device.

2. Description of the Related Art

Integrated circuits (ICs) are composed of many, e.g., millions, of devices such as transistors, capacitors, and resistors. Transistors, such as field effect transistors (FETs), typically include a source, a drain, and a gate stack. The gate stack generally includes a substrate, such as a silicon substrate, a gate dielectric, and a gate electrode, such as polycrystalline silicon, on the gate dielectric. The gate dielectric layer is formed of dielectric materials such as silicon dioxide ($SiO_2$), or a high-k dielectric material having a dielectric constant greater than 4.0, such as SiON, SiN, hafnium oxide ($HfO_2$), hafnium silicate ($HfSiO_2$), hafnium silicon oxynitride (Hf-SiON), zirconium oxide ($ZrO_2$), zirconium silicate ($ZrSiO_2$), barium strontium titanate ($BaSrTiO_3$, or BST), lead zirconate titanate ($Pb(ZrTi)O_3$, or PZT), and the like. It should be noted, however, that the film stack may comprise layers formed of other materials.

As integrated circuit sizes and the sizes of the transistors thereon decrease, the gate drive current required to increase the speed of the transistor has increased. The drive current increases as the gate capacitance increases, and capacitance (C) is proportional to kA/d, wherein k is the dielectric constant of the gate, d is the dielectric thickness, and A is the area of the device. Decreasing the dielectric thickness and increasing the dielectric constant of the gate dielectric are methods of increasing the gate capacitance and the drive current.

Attempts have been made to reduce the thickness of $SiO_2$ gate dielectrics below 20 Å. However, it has been found that the use of $SiO_2$ gate dielectrics below 20 Å often results in undesirable effects on gate performance and durability. For example, boron from a boron doped gate electrode can penetrate through a thin $SiO_2$ gate dielectric into the underlying silicon substrate. Also, there is typically an increase in gate leakage current, i.e., tunneling current, with thin dielectrics that increases the amount of power consumed by the gate. Thin $SiO_2$ gate dielectrics may be susceptible to NMOS (n-channel metal oxide semiconductor) hot carrier degradation, in which high energy carriers traveling across the dielectric can damage or destroy the channel. Thin $SiO_2$ gate dielectrics may also be susceptible to PMOS (p-channel metal oxide semiconductor) negative bias temperature instability (NBTI), wherein the threshold voltage or drive current drifts with operation of the gate.

A method of forming a dielectric layer suitable for use as the gate dielectric layer in a MOSFET (metal oxide semiconductor field effect transistor) includes nitridizing a thin silicon oxide film in a nitrogen-containing plasma. Increasing the net nitrogen content in the gate oxide to increase the dielectric constant is desirable for several reasons. For example, the bulk of the oxide dielectric may be lightly incorporated with nitrogen during the plasma nitridation process, which reduces the equivalent oxide thickness (EOT) over the starting oxide. This may result in a gate leakage reduction, due to tunneling during the operation of a FET, at the same EOT as the un-nitrided oxide dielectric. At the same time, such an increased nitrogen content may also reduce damage induced by Fowler-Nordheim (F-N) tunneling currents during subsequent processing operations, provided that the thickness of the dielectric is in the F-N range. Another benefit of increasing the net nitrogen content of the gate oxide is that the nitridized gate dielectric is more resistant to the problem of gate etch undercut, which in turn reduces defect states and current leakage at the gate edge.

The plasma of the plasma nitridation process can be created by various ionizing power sources, which may, for example, include an inductively-coupled power source, a capacitively-coupled power source, a surface wave power source, an electronic cyclotron resonance source (ECR source), magnetron or modified magnetron-type sources, or other ionizing sources that may be used to facilitate plasma generation in a processing chamber. A surface wave power source is a very high frequency (100 MHz to 10 GHz) plasma source, in which the gas collision frequency is much less than the electromagnetic wave frequency, such that the electromagnetic power is absorbed into the plasma by a "surface-wave" or "wave-heating" based energy transfer mechanism. Such a source typically includes a very high frequency power source, a wave guide connecting the power source to the chamber, a dielectric chamber wall and an arrangement of openings or slots adjacent to the dielectric wall in which the very high frequency power is coupled in to the chamber. A microwave ionization power source is a type of surface wave power source.

In order to ignite (i.e., start) a plasma in a processing chamber, there is typically a source of high voltage generating a strong electric field to accelerate some free electrons in a gas mixture contained within the chamber. Once such accelerated electrons gain enough energy and collide with the molecules of the gas mixture, the gas molecules will ionize and more electrons may be freed. These ionized gas molecules or atoms (ions) and electrons may then be further excited by an oscillating electric or magnetic field, such as that provided by a radio frequency (RF) generator or other type of excitation source, to create even more ionization in the gas mixture, thereby resulting in an avalanche effect of generating more and more charged particles. The plasma becomes sustaining when the energy input to the plasma from the excitation source equals the energy lost from the plasma.

Independent of the type of excitation source, there can be significant capacitive coupling from the source to the plasma, which creates a relatively large plasma potential (on the order of tens of volts) and a strong electric field normal to the surface of a substrate being processed in a plasma reactor. Since such a strong electric field causes ions or electrons to be accelerated with high kinetic energy towards the substrate surface, capacitive coupling may cause excessive bombardment of the surface of a substrate, such as the silicon dioxide layer, by nitrogen ions, for example, which can cause damage to the substrate surface. Therefore, inductively-coupled plasma is preferred since the excitation field is parallel to the substrate surface.

However, devices for maintaining inductively-coupled plasma typically cannot ignite the plasma because inductive coupling cannot generate high energy electrons to start the avalanche process described above. In such systems, either a secondary excitation source using capacitively-coupled RF is employed or the inductively-coupled RF source has a small capacitively-coupled element present to ignite the plasma, which may still lead to some damage to the substrate surface.

Accordingly, what are needed are a method and an apparatus for plasma ignition and maintenance that do not cause excessive damage of the substrate surface with energized ions or electrons.

SUMMARY OF THE INVENTION

Embodiments of the present invention generally provide a means to ignite a gas mixture into plasma using capacitive coupling techniques, shield the plasma and other contents of the plasma reactor from the capacitively-coupled electric field, and maintain the plasma using inductive coupling.

One embodiment of the present invention is a method for processing a substrate. The method generally includes locating the substrate within a substantially enclosed volume of a plasma reactor; performing an action to initiate ignition of a gas mixture within the enclosed volume into a plasma by supplying power to one or more radio frequency (RF) coils disposed adjacent to the enclosed volume; in response to detecting an event indicative of plasma ignition, connecting an electrode interposed between the RF coils and the enclosed volume to a ground source to prevent capacitive coupling of the power to the plasma; and further processing the substrate using inductively-coupled plasma.

Another embodiment of the present invention is a method for processing a substrate. The method generally includes locating the substrate within a substantially enclosed volume of a plasma reactor; performing an action to initiate ignition of a gas mixture within the enclosed volume into a plasma by supplying power to one or more RF coils disposed adjacent to the enclosed volume; in response to detecting an event indicative of plasma ignition, connecting an electrode interposed between the RF coils and the enclosed volume to a ground source to prevent capacitive coupling of the power to the plasma; and further processing the substrate while the electrode is cycled between being connected and disconnected from the ground source.

Yet another embodiment of the present invention is a method of igniting and maintaining a plasma in a processing chamber having a substantially enclosed volume, an excitation source disposed adjacent to the enclosed volume, and a shielding electrode interposed between the enclosed volume and the excitation source, wherein the excitation source provides an electric field and a magnetic field. The method generally includes providing a gas mixture in the enclosed volume; exciting the gas mixture with the electric field from the excitation source to ignite the gas mixture into the plasma; after an event indicating the presence of the plasma within the enclosed volume, electrically grounding the shielding electrode to provide a return path for the electric field and prevent the presence of the electric field within the enclosed volume; and maintaining the plasma with the magnetic field from the excitation source after the shielding electrode is grounded.

Yet another embodiment of the present invention provides an electronic circuit. The electronic circuit generally includes means for detecting an event related to an ignition of plasma within a processing chamber having a substantially enclosed volume, an excitation source disposed adjacent to the enclosed volume, and an electrically floating electrode interposed between the enclosed volume and the excitation source; and means for connecting the electrode to a ground source based on the event.

Yet another embodiment of the present invention provides a processing chamber. The processing chamber generally includes a substantially enclosed volume for containing a gas mixture to be ignited into a plasma; an excitation source disposed adjacent to the enclosed volume for performing an action to initiate ignition of the gas mixture into plasma; an electrically floating electrode disposed between the enclosed volume and the excitation source; and a switch configured to connect the electrode to a ground source based on an event indicative of the ignition of the gas mixture into plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a means to ignite a gas mixture into plasma using capacitive coupling techniques, shield the plasma and other contents of the plasma reactor from the capacitively-coupled electric field, and maintain the plasma using inductive coupling. Such techniques are employed in an effort to prevent damage to the surface of a substrate from excessive ion bombardment caused by the highly energized ions and electrons accelerated towards and perpendicular to the substrate surface by the electric field of capacitively-coupled plasma.

An Exemplary Plasma Reactor

Figure 1:
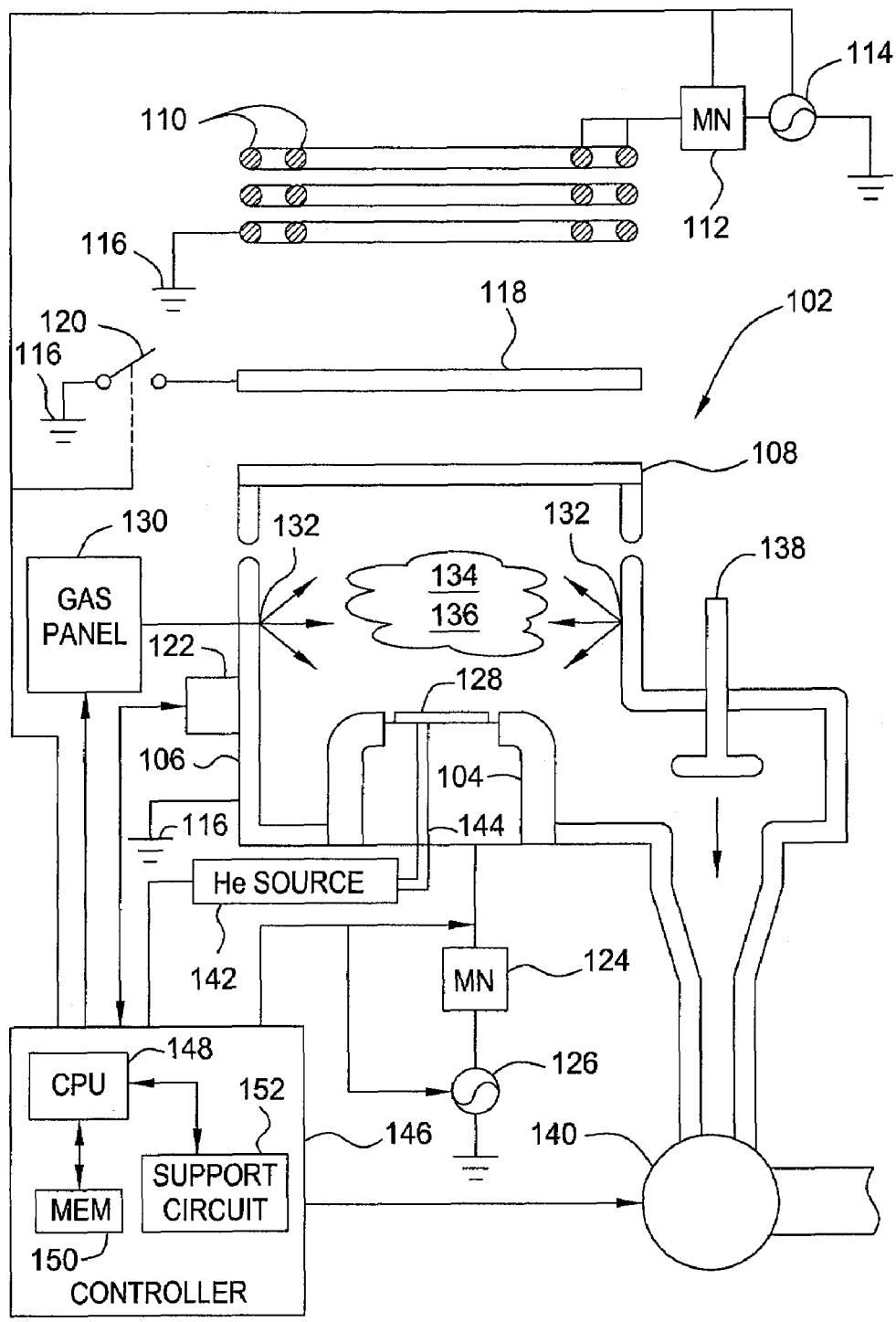
FIG. 1 is a schematic diagram in cross section of a plasma reactor in accordance with an embodiment of the invention.

FIG. 1 depicts a schematic, cross-sectional diagram of a plasma reactor 100 that may be used to ignite plasma according to embodiments of the present invention. The plasma reactor 100 may be a slightly modified version of the Decoupled Plasma Nitridation (DPN) or DPN Plus chambers made by Applied Materials located in Santa Clara, Calif. Primarily an inductive plasma source reactor, plasma reactor 100 may comprise a process chamber 102 having a wafer support pedestal 104 within a conductive chamber wall 106. Typically, the chamber wall 106 is coupled to an electrical ground 116. The chamber 102 may be covered by a flat dielectric lid 108 composed of any suitable dielectric, such as quartz. For some embodiments, the dielectric lid 108 may assume a different shape (e.g., dome-shaped).

Above the lid 108, a radio frequency (RF) antenna comprising at least one inductive coil element 110 (two coaxial coil elements are shown) may be disposed. For some embodiments, the inductive coil elements 110 may be disposed around at least a portion of the chamber wall 106. One end of the inductive coil element 110 may be coupled, through a first impedance matching network 112, to an RF power source 114, and the other end may end may be connected to an electrical ground 116 as shown. The power source 114 typically is capable of producing up to 10 kilowatts (kW) at a tunable frequency in a range from 2 to 160 MHz, with 13.56 MHz being a typical operating frequency. The RF power supplied to the inductive coil elements 110 may be pulsed (i.e., switched between an on and an off state) at a frequency ranging from 1 to 100 kHz.

Figure 2A:
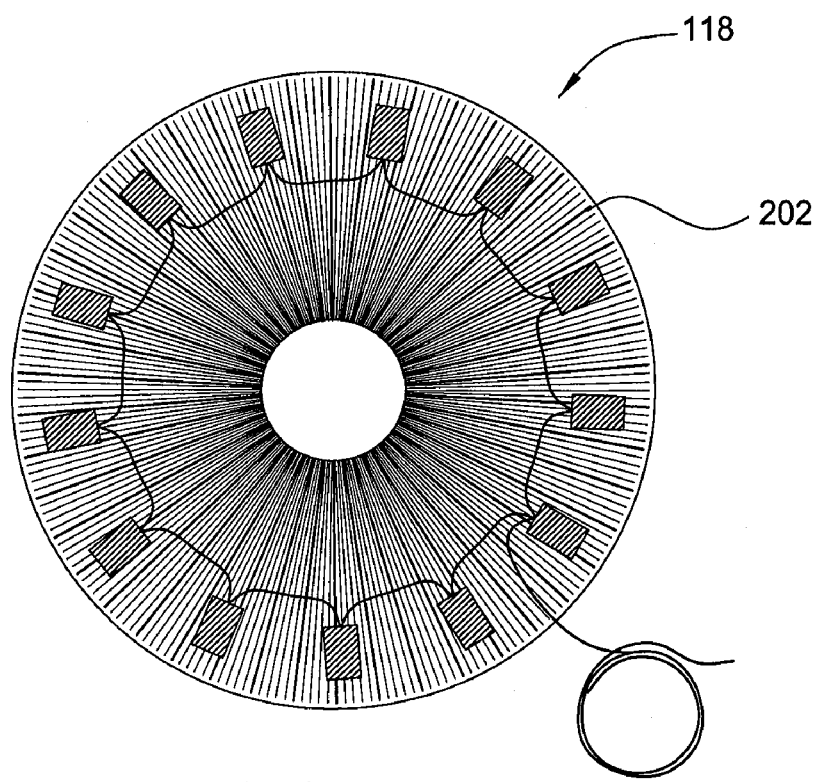
FIGS. 2A-B illustrate shielding electrodes in accordance with embodiments of the invention.
Figure 2B:
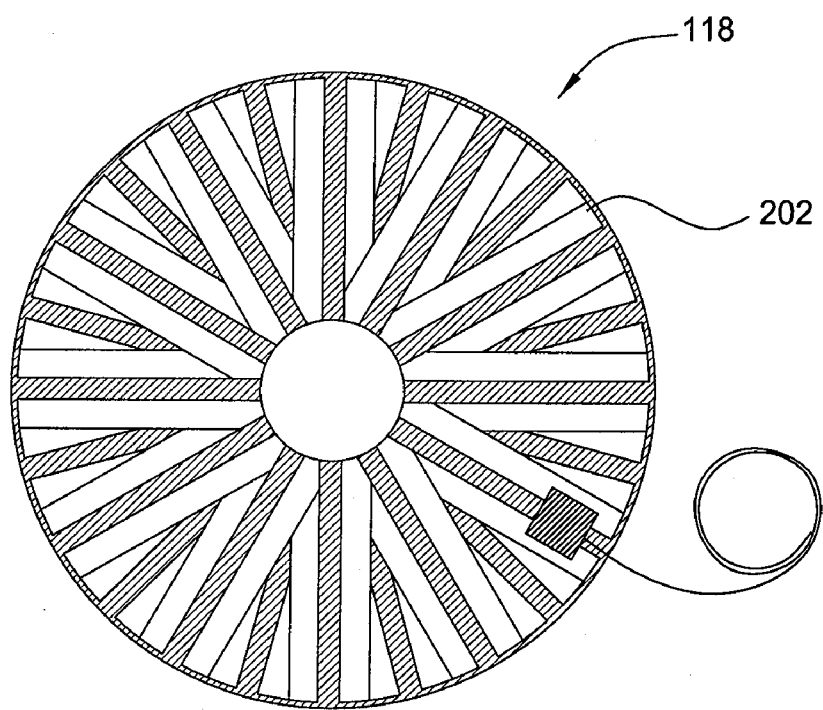

Interposed between the inductive coil elements 110 of the RF antenna and the dielectric lid 108 may be a shielding electrode 118. The shielding electrode 118 may be flat or dome-shaped and may comprise a plurality of conductor segments 202 arranged in various patterns, as illustrated in FIGS. 2A-B. The diameter of the shielding electrode 118 may most likely be larger than the diameter of the coil elements 110 and may be equal to the dielectric lid 108 for some embodiments. The shielding electrode 118 may be alternately electrically floating or coupled to electrical ground 116 via any suitable means for making and breaking an electrical connection, such as a switch 120 as illustrated in FIG. 1. The switch 120 may be manually operated or automated and may comprise, for example, an electromechanical (EM) relay or a solid state relay (SSR). The operation and purpose of the shielding electrode 118 and switch 120 will be described below.

For some embodiments, a detector 122 may be attached to the chamber wall 106 in an effort to determine when the gas mixture within the chamber 102 has been ignited into plasma. The detector 122 may, for example, detect the radiation emitted by the excited gases or use optical emission spectroscopy (OES) to measure the intensity of one or more wavelengths of light associated with the generated plasma. Although not shown in FIG. 1, other types of detectors besides a radiation detector or an optical emission spectrometer, such as a voltmeter, an ammeter, a voltage/current (V/I) probe, or a digital multimeter (DMM), may be positioned to measure the voltage and/or current on the coil elements 110 of the RF antenna or the shielding electrode 118. For example, a sudden drop in voltage on the coil elements 110 or the shielding electrode 118 may indicate plasma ignition.

As an option for some embodiments of the plasma reactor 100, the support pedestal 104 may be coupled, through a second impedance matching network 124, to a biasing power source 126. The biasing power source 126 is generally capable of producing an RF signal having a tunable frequency ranging from 2 to 160 MHz and power between 0 and 10 kW, similar to the RF power source 114. Optionally, the biasing power source 126 may be a direct current (DC) or pulsed DC source. However, the biasing power source 126 is typically disconnected during processing.

In operation, a substrate 128, such as a semiconductor wafer, may be placed on the pedestal 104, and process gases may be supplied from a gas panel 130 through entry ports 132 in an effort to form a gaseous mixture 134. Although the operations will be described below in greater detail, the gaseous mixture 134 may be ignited into a plasma 136 in the chamber 102 by applying power from the RF power source 114. The pressure within the interior of the chamber 102 may be controlled using a throttle valve 138 and a vacuum pump 140. For some embodiments, the temperature of the conductive wall 106 may be controlled using liquid-containing conduits (not shown) that run through the wall 106 or heating elements embedded in the wall 106 (e.g., heating cartridges or coils) or wrapped around the chamber 102 (e.g., heater wrap or tape).

The temperature of the substrate 128 may be controlled by stabilizing the temperature of the support pedestal 104. For some embodiments, helium (He) gas from a gas source 142 may be provided via a gas conduit 144 to channels (not shown) formed in the pedestal surface under the substrate 128. The helium gas may facilitate heat transfer between the pedestal 104 and the substrate 128. During processing, the pedestal 104 may be heated by a heating element (not shown), such as a resistive heater, embedded within the pedestal 104 or a lamp generally aimed at the pedestal 104 or the substrate 128 thereon to a steady state temperature, and then the helium gas may facilitate uniform heating of the substrate 128. Using such thermal control, the substrate 128 may be maintained at a temperature between about 20 to 350 degrees Celsius (° C.). Depending on the desired pressure within the chamber 102, other embodiments may not employ helium gas.

In order to allow for control of the components of the processing chamber 102 as described herein, a controller 146 may be provided. The controller 146 may comprise a central processing unit (CPU) 148, a memory 150, and support circuits 152 for the CPU 148. The controller 146 may interface with the RF power source 114, the switch 120, the detector 122, and the biasing power source 126.

The controller 146 may be any suitable type of general-purpose computer processor that can be used in an industrial setting for controlling various chambers and sub-processors. The memory 150, or other computer-readable medium, for the CPU 148 may be one or more of any readily available memory forms, such as random access memory (RAM), read only memory (ROM), a floppy disk, a hard disk, or any other form of digital storage, local or remote. The support circuits 152 may be coupled to the CPU 148 in an effort to support the processor in a conventional manner. These circuits may include cache, power supplies, clock circuits, input/output (I/O) circuitry and subsystems, and the like. For some embodiments, the techniques disclosed herein for igniting and maintaining a plasma may be stored in the memory 150 as a software routine. The software routine may also be stored and/or executed by a second CPU (not shown) that is remotely located from the hardware being controlled by the CPU 148.

An Exemplary Plasma Ignition and Maintenance Technique

Referring now to the flow diagram 300 of FIG. 3, exemplary steps for igniting and maintaining a plasma according to embodiments of the invention and using the plasma reactor 100 of FIG. 1 as an example will now be described.

In step 302, a gaseous mixture 134 may be supplied into the internal volume of the chamber 102. The gaseous mixture 134 may be provided by the gas panel 130 and may enter the chamber 102 via one or more entry ports 132. Throughout these operations, the pressure within the interior of the chamber 102 may be controlled using a throttle valve 138 and a vacuum pump 140, which may be controlled by the controller 146.

Figure 4A:
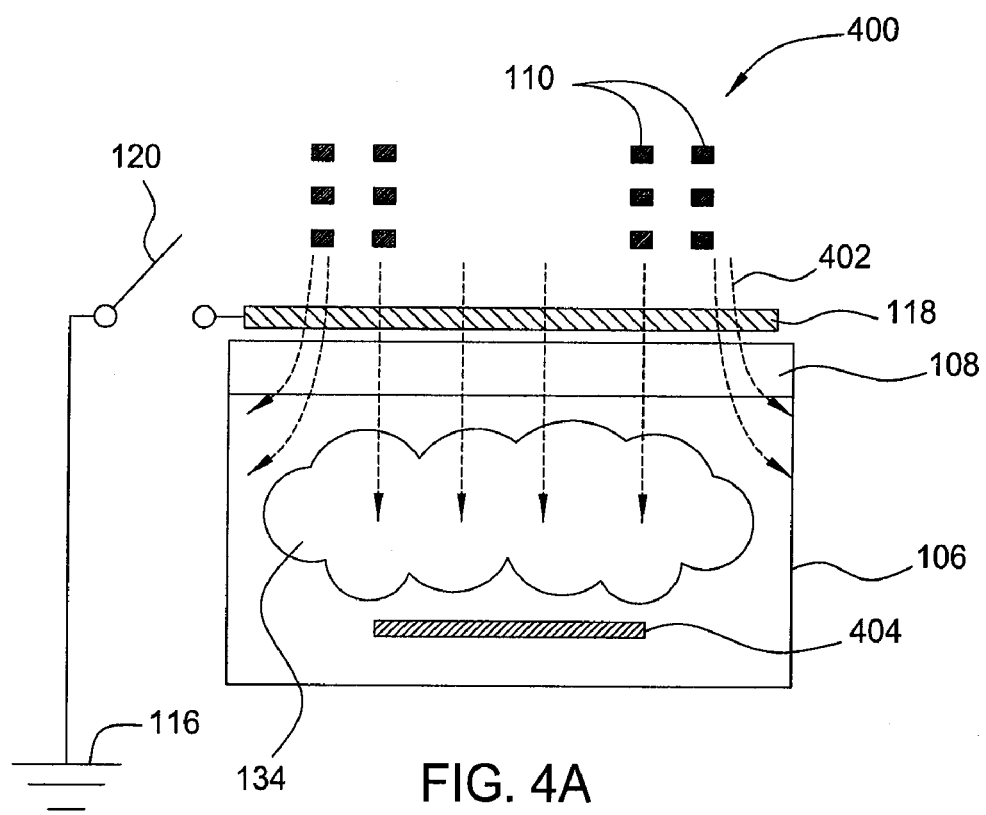
FIGS. 4A-B illustrate floating a shielding electrode in an effort to ignite a plasma with an electric field and then grounding the shielding electrode in an effort to provide a return path for the electric field in accordance with an embodiment of the invention.

The RF power source 114 may be powered on in step 304 in an effort to excite the gaseous mixture 134 via capacitive coupling. The dielectric lid 108 may serve to increase the capacitance between the RF coils and the contents of the chamber 102. The RF power source 114 may provide a high electric potential, thereby generating a strong electric field 402 as shown in the simplified diagram 400 of FIG. 4A. The strong electric field 402 may accelerate some free electrons in the gaseous mixture 134, and when these accelerated electrons gain enough energy and collide with the molecules of the gaseous mixture 134, the gas molecules may ionize and more electrons may become freed. These ionized molecules or atoms (i.e., ions) and electrons may then be further excited by the oscillating electric and magnetic fields provided by the RF power source 114 and the coil elements 110 of the RF antenna to create more ionization in the gaseous mixture 134. This process may result in an avalanche effect generating more and more charged particles.

In an effort to avoid damage to a wafer 404 by excessive ion bombardment from energized ions and electrons present in capacitively-coupled plasma, the detector 122 may be operated in step 306 to monitor for an event indicative of plasma ignition. As described above, the detector 122 may measure, for example, radiation emitted from the excited gases in the chamber 102, optical emission from the plasma, or a change in voltage or current on the coil elements 110, the shielding electrode 118, or elements associated with and including the biasing power source 126. The event may be a certain level of radiation emitted by excited gases of the plasma, a change in an optical emission spectrograph, a change in voltage, or a change in current. The detector 122 may comprise an electronic circuit which sends a control signal to the switch 120 and/or sends one or more measurement signals to the controller 146 for signal processing and interpretation by the controller 146 or an operator.

For some embodiments, a counter or timer may be used instead of a detector to determine when a predetermined length of time (the event, in this case) has passed and plasma ignition should have occurred. Although not as accurate as the use of a detector, the timer in such embodiments may start timing, for example, from the moment the RF power source 114 is turned on. A timer may be a possible alternative to a detector when the time from a triggering event, such as RF power source start-up, to plasma ignition is a constant. Other triggering events during plasma ignition involving a constant length of time may also be envisioned and used. Rather than a separate integrated circuit, the timer may be a component of the controller 146.

In step 308, if the event indicative of plasma ignition has not yet been detected by the detector 122, the process enters a waiting loop until the event is detected. For some embodiments, the controller 146 or an operator may determine whether the event has been detected. The waiting loop may have a timeout to escape from the loop in case plasma ignition does not occur or is not detected. Reaching or exceeding this timeout value may indicate that there is a problem with the detector 122, connections between the detector 122 and the controller 146, or the delivery of gas into the chamber 102, among other things.

Figure 4B:
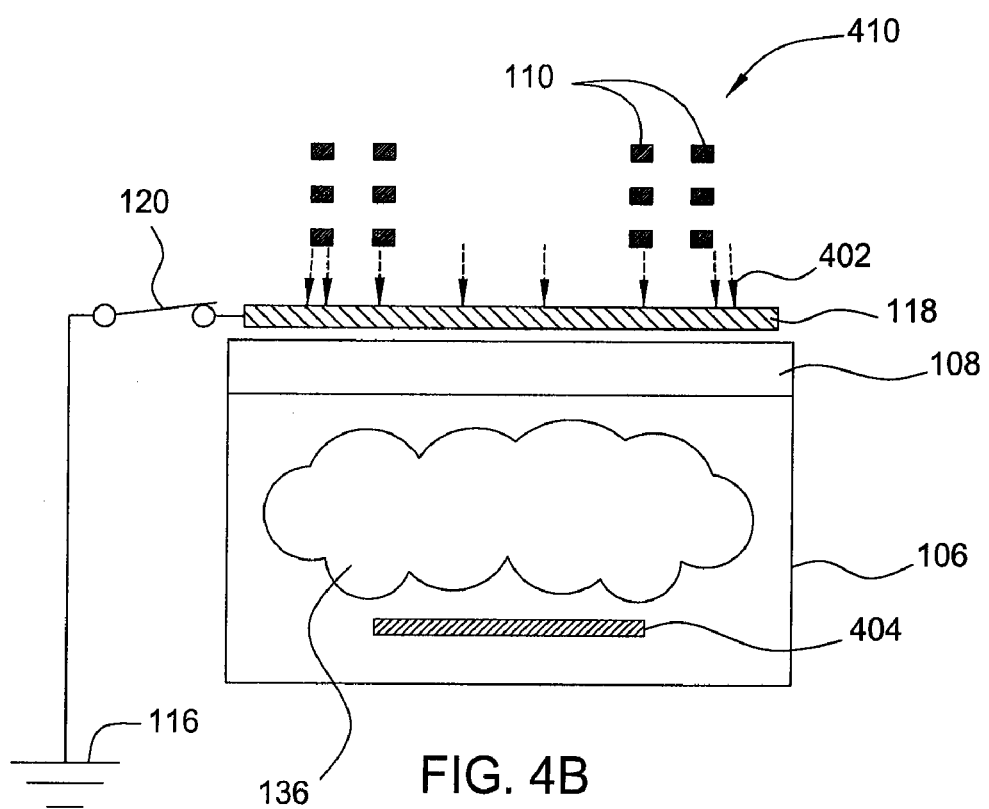

Once the event indicative of plasma ignition is detected in step 308, the shielding electrode 118 may be connected to electrical ground 116 for the plasma reactor 100 in step 310, thereby providing a return path for the electric field 402 as shown in FIG. 4B. Thus, the shielding electrode 118 may shield the contents of the chamber 102 from the electric field 402, and, in such cases, the plasma 136 is no longer capacitively coupled. The shielding electrode 118 may be connected to ground 116 by a manually operated or automated switch 120. An automated switch 120 may comprise, for example, an electromechanical (EM) relay or a solid state relay (SSR), and control for the operation of the switch 120 may be provided by the detector 122 directly or via the controller 146 as illustrated in FIG. 1.

Since the detection of radiation emitted from the excited gases or changes in voltage or current occur almost instantaneously with plasma ignition and the switch 120 can be closed within a few milliseconds thereafter, the exposure of the wafer 404 or other type of substrate to the bombardment by energized electrons and ions of the capacitively-coupled plasma may be very short. The shielding electrode 118 may be designed in an effort so that, when grounded, it prevents (or substantially inhibits) the high voltage electric field 402 from penetrating into the chamber 102 containing the plasma 136, as illustrated in FIG. 4B.

Figure 5:
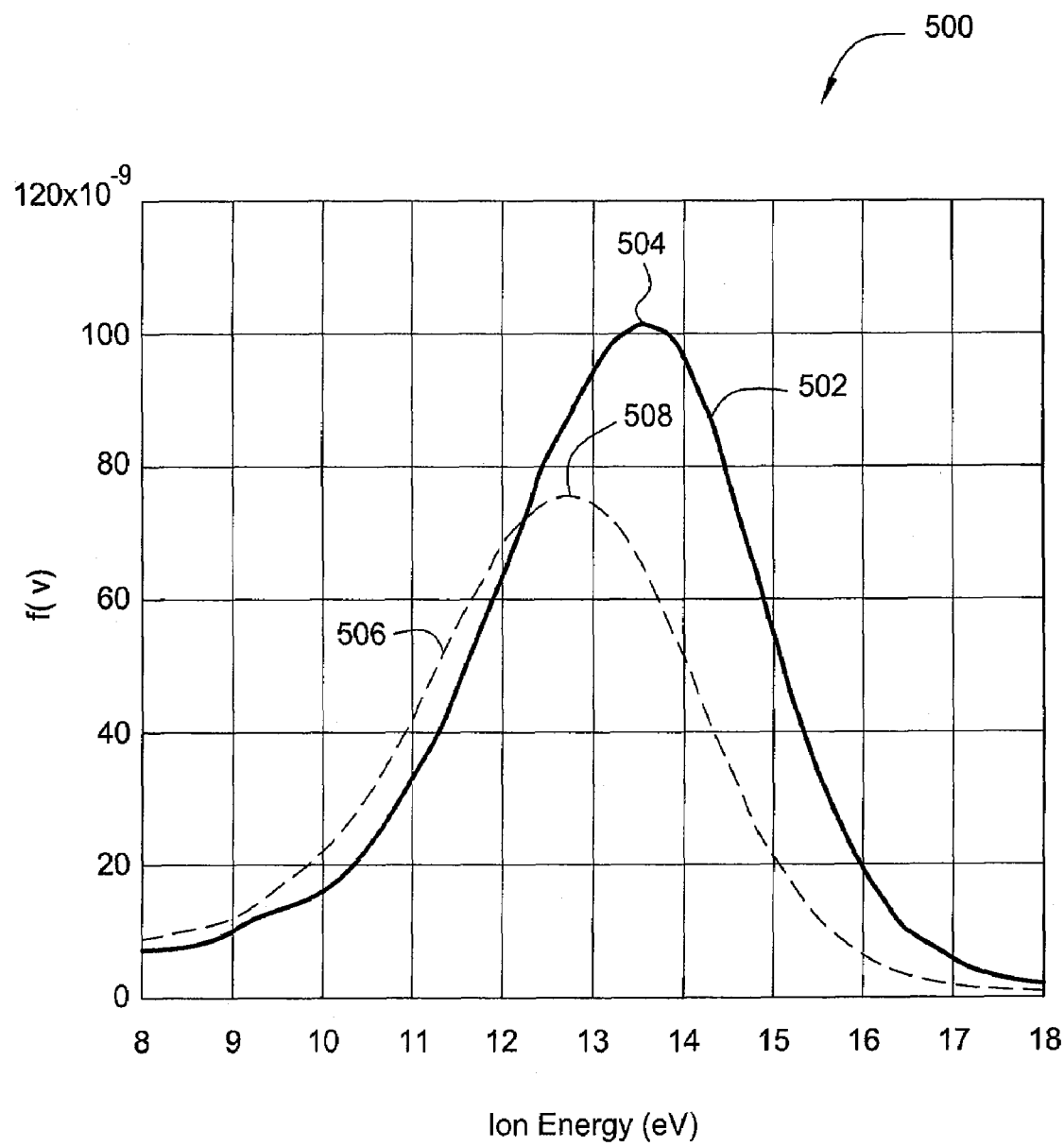
FIG. 5 is a graph of ion energy distributions in a plasma before and after grounding the shielding electrode of a plasma reactor in accordance with an embodiment of the invention.

Proof of the reduced ion bombardment may seen in the ion energy distribution graph 500 of FIG. 5 from experiments with the shielding electrode 118 and the switch 120 to ground 116. The solid line 502 represents the measured ion energy distribution of nitrogen plasma ions impinging on the surface of a wafer inside the processing chamber while the shielding electrode is electrically floating. The distribution of the solid line 502 is relatively narrower with a sharper peak 504 at around 13.5 eV (electron volts). The dashed line 506 represents the measured ion energy distribution of nitrogen plasma ions after the shielding electrode is grounded according to embodiments of the invention. The distribution of the dashed line 506 is relatively more spread out with a peak 508 at around 12.6 eV. Furthermore, the graph 500 shows that after the electrode 118 is grounded, there are fewer ions at higher energy levels (i.e., above about 12.3 eV up until at least 18 eV).

Figure 3:
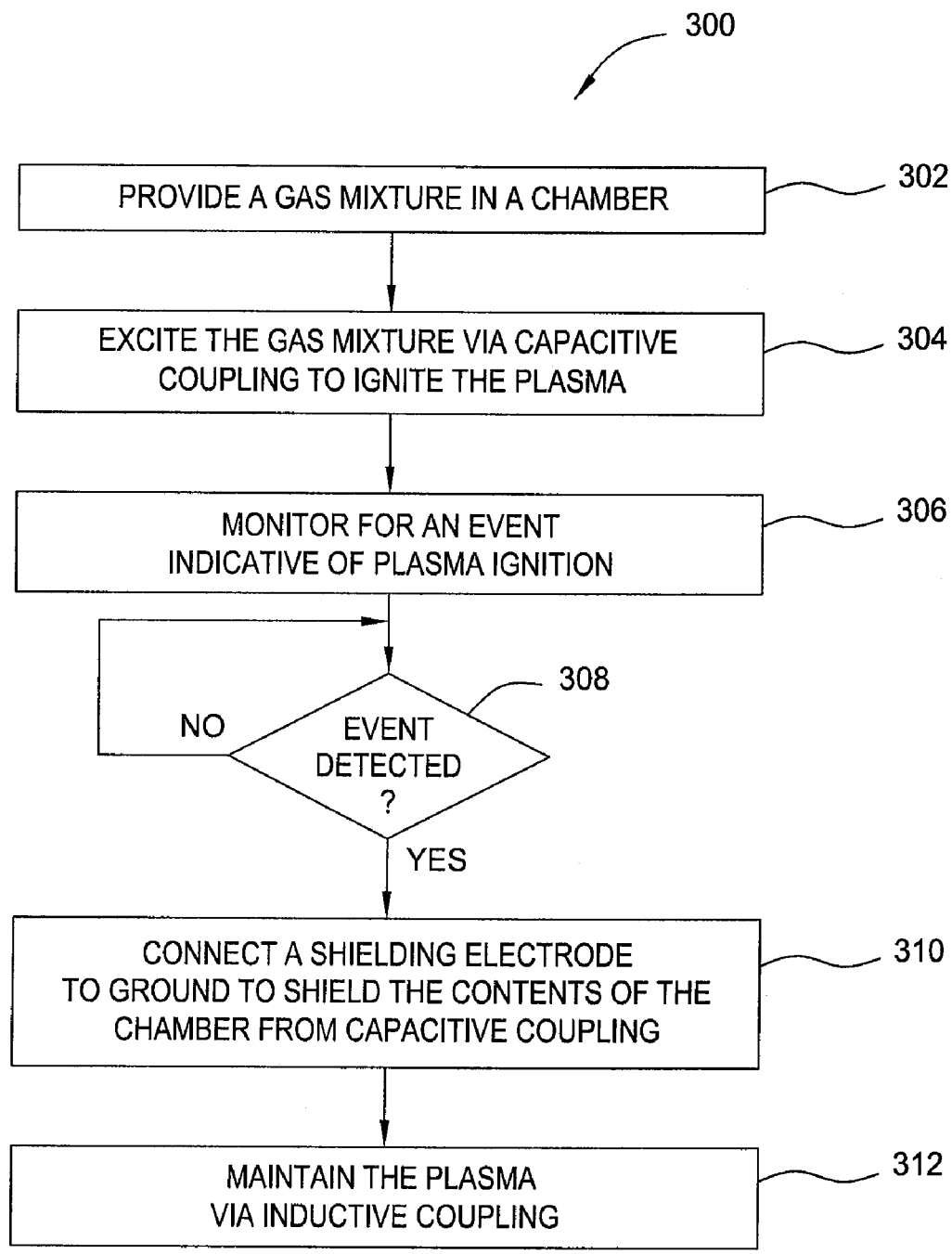
FIG. 3 is a flow diagram illustrating ignition and maintenance of a plasma in accordance with an embodiment of the invention.

Referring now to step 312 of FIG. 3, once the shielding electrode 118 is grounded, only the magnetic field (not shown) generated in the inductive coil elements 110 by the RF power source 114 may be coupled into the chamber 102 to provide the RF energy to sustain the plasma 136, now an inductively-coupled plasma, for additional processing of the wafer 404 or other substrate 128. As described above, inductively-coupled plasma may be preferred over capacitively-coupled plasma since the excitation field is parallel to the surface of the wafer 404.

Because embodiments of the invention may have a detector 122 or other instrumentation for measuring such parameters as radiation from excited gases, optical emission, voltage, current, ion energy distribution, and the like, some operators may opt to continue monitoring such parameters to ensure that the shield stays grounded or that the plasma remains inductively coupled during subsequent processing of the substrate 128. Such continuous monitoring may help to ensure increased manufacturing yields for semiconductor wafers processed in a plasma reactor according to embodiments of the invention.

After plasma ignition has been detected in step 308 for some embodiments, the shielding electrode 118 may be cycled between being connected to and disconnected from electrical ground 116. This may allow a plasma reactor operator to control the amount of capacitive coupling that energizes the plasma 136 rather than simply maintaining an inductively-coupled plasma only. The grounding of the electrode 118 may be cycled at a specified frequency or may occur in response to certain parameters. For example, the electron or ion energy distribution of the plasma may be monitored and used as a feedback mechanism to control the cycling of the electrode connection. For some embodiments where the electrode connection to ground 116 is cycled, the RF power source 114 may be pulsed (typically at a frequency of 1 to 100 kHz) in an effort to further control the amount of capacitive coupling. The pulse frequency may be based on modeled or measured performance. For some embodiments, the shielding electrode 118 may be cycled synchronously with the pulsing of the RF power source 114 or another chamber response characteristic of the pulsed power.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
   locating the substrate within a substantially enclosed volume of a plasma reactor;
   performing an action to initiate ignition of a gas mixture within the enclosed volume into a plasma by supplying power to one or more radio frequency (RF) coils disposed adjacent to the enclosed volume;
   in response to detecting an event indicative of plasma ignition, connecting an electrode interposed between the RF coils and the enclosed volume to a ground source to prevent capacitive coupling of the power to the plasma; and
   processing the substrate while the electrode is cycled between being connected and disconnected from the ground source.

2. The method of claim 1, wherein the event comprises at least one of radiation emitted by excited gases of the plasma, a change in an optical emission spectrograph, a change in voltage, a change in current, and a period of time.

3. The method of claim 1, wherein the detecting the event is performed with a detector.

4. The method of claim 3, wherein the detector comprises at least one of a radiation detector, an optical emission spectrometer, a voltmeter, an ammeter, and a voltage/current (V/I) probe.

5. The method of claim 1, wherein connecting the electrode to the ground source comprises closing a switch coupled to the electrode at a first terminal and coupled to the ground source at a second terminal, the first terminal connected to (disconnected from) the second terminal when the switch is closed (open).

6. The method of claim 1, further comprising monitoring an ion energy distribution of the plasma, wherein the electrode is cycled based on the ion energy distribution.

7. The method of claim 1, further comprising pulsing the power supplied to the RF coils to control the ion energy distribution.

8. The method of claim 7, wherein the ion energy distribution of the plasma is modeled or measured.

9. The method of claim 7, wherein the electrode is cycled synchronously with the pulsing of the power supplied to the RF coils.

10. The method of claim 1, wherein the detecting the event is performed with a timer to determine if a predetermined length of event has passed.

* * * * *